US008975701B2

(12) United States Patent
Hong

(10) Patent No.: US 8,975,701 B2
(45) Date of Patent: Mar. 10, 2015

(54) ANTIFUSE OF SEMICONDUCTOR DEVICE AND METHOD OF FABRICATING THE SAME

(71) Applicant: SK Hynix Inc., Icheon-si (KR)

(72) Inventor: Yeong Eui Hong, Seongnam-si (KR)

(73) Assignee: SK Hynix Inc., Icheon (KR)

( * ) Notice: Subject to any disclaimer, the term of this patent is extended or adjusted under 35 U.S.C. 154(b) by 112 days.

(21) Appl. No.: 13/714,353

(22) Filed: Dec. 13, 2012

(65) Prior Publication Data

US 2014/0124864 A1 May 8, 2014

(30) Foreign Application Priority Data

Nov. 6, 2012 (KR) .................. 10-2012-0124974

(51) Int. Cl.
  *H01L 29/78* (2006.01)
  *H01L 29/66* (2006.01)
  *H01L 23/525* (2006.01)
  *H01L 27/112* (2006.01)
(52) U.S. Cl.
  CPC .......... *H01L 29/78* (2013.01); *H01L 29/66409* (2013.01); *H01L 23/5252* (2013.01); *H01L 27/11206* (2013.01)
  USPC .............................. 257/355; 257/530; 257/50
(58) Field of Classification Search
  CPC ..................... H01L 23/5252; H01L 27/11206
  USPC ...................................... 257/50, 530, E23.147
  See application file for complete search history.

(56) References Cited

U.S. PATENT DOCUMENTS

| | | | |
|---|---|---|---|
| 7,642,138 B2 | 1/2010 | Kurjanowicz | |
| 2002/0185694 A1* | 12/2002 | Ooishi et al. | 257/393 |
| 2006/0244099 A1* | 11/2006 | Kurjanowicz | 257/530 |
| 2006/0292754 A1* | 12/2006 | Min et al. | 438/131 |
| 2009/0224324 A1* | 9/2009 | Nakamura | 257/355 |
| 2009/0224325 A1* | 9/2009 | Min et al. | 257/355 |
| 2009/0250726 A1* | 10/2009 | Kurjanowicz | 257/209 |
| 2011/0042735 A1* | 2/2011 | Ishigaki | 257/314 |
| 2012/0012943 A1 | 1/2012 | Jung | |
| 2012/0091557 A1* | 4/2012 | Lee | 257/530 |
| 2012/0153404 A1* | 6/2012 | Ahn et al. | 257/402 |
| 2013/0062698 A1* | 3/2013 | Agam et al. | 257/368 |

FOREIGN PATENT DOCUMENTS

KR  10-2012-0006707 A   1/2012
KR  10-2012-0038591 A   4/2012

* cited by examiner

*Primary Examiner* — Long K Tran
*Assistant Examiner* — Jordan Klein

(57) ABSTRACT

An antifuse of a semiconductor device and a method of fabricating the same capable of causing an antifuse to stably operate by rupturing the antifuse at a specific point and stabilizing a current level when rupturing the antifuse are provided. The antifuse may include: a device isolation layer defining a first active region in a semiconductor substrate; a first and second junction regions provided in the first active region; a second active region formed over the first junction region; a gate insulating layer formed over the first active region and the second active region; and a gate electrode formed over the gate insulating layer.

19 Claims, 6 Drawing Sheets

ANTIFUSE OF SEMICONDUCTOR DEVICE AND METHOD OF FABRICATING THE SAME

CROSS-REFERENCES TO RELATED APPLICATION

The present application claims priority to Korean patent application number 10-2012-124974, filed on 6 Nov. 2012, which is incorporated by reference herein in its entirety.

BACKGROUND OF THE INVENTION

The embodiments of the present invention relates to an antifuse of a semiconductor device and a method of fabricating the same, and more particularly, to technology capable of causing an antifuse to stably operate by rupturing the antifuse at a specific point and stabilizing a current level needed for rupturing the antifuse.

In recent years, with the rapid spread of information devices such as computers, the continued development of semiconductor devices has been needed. In terms of semiconductor device function, desirable characteristics include high-speed operation and large storage capacity. Thus, semiconductor fabrication techniques have been developed to improve integration, reliability, and response speed.

Existing methods of fabricating semiconductor devices include a fabrication (FAB) process which repeatedly forms preset circuit patterns on a substrate which is typically formed of a silicon material to form cells having integrated circuits, and an assembly process which packages the substrate in which the cells are formed in units of chips. An electrical die sorting (EDS) process for testing electrical characteristics of the cells may also be performed before assembly.

The EDS process determines whether the cells formed on the substrate are in an electrically good state or in a failed state. The chips with cells that have failed are removed during the EDS process before the assembly process is performed to improve cost and efficiency. In addition, defective cells may be detected in advance and then repaired through a repair process.

Hereinafter, the repair process will be described.

Redundant cells are added to a semiconductor device, and may be used to replace failed circuits to improve yield. Fuses are designed to disconnect the failed cells in an integrated circuit. When a failed circuit is detected, a fuse may be cut to replace the failed circuit with redundant cells.

Even after the EDS repair process has been performed to repair the defective cells at the wafer level, 1-bit or 2-bit defects may occur in a device that passed the EDS test after the package process is performed. Thus, even when the EDS process is performed at the wafer level, defects may still occur in packaged devices (e.g., defect rate of about 10%), and thus a repair process following the packaging process is performed. In particular, in multi-chip packages, dynamic random access memories (DRAMs), and relatively high-priced flash RAMs, 1-bit or 2-bit defects occurring or detected after packaging may cause a device to fail. Thus, a repair process performed on packaged devices can improve manufacturing yields and reduce the chance of shipping defective units.

However, laser repair equipment used before packaging is not usable following the packaging process, so a repair process after packaging may use different types of fuses and techniques from the repair process prior to packaging.

Hereinafter, a fuse used in the repair process following packaging will be described.

A fuse used in the repair process following the packaging process is an antifuse. This is because the repair process prior to the packaging process is performed by cutting fuses (i.e., break an electrical connection), while the repair process following the packaging process is performed by establishing an electrical connection between elements which were not previously connected. Thus, an antifuse may be a fuse which is an open circuit in a normal state, and is short-circuited when an insulator between conductors is ruptured by applying a high voltage. The antifuse is formed in a peripheral circuit area and redundant cells for the antifuse are also formed in the peripheral circuit area. The redundant cells may be static random access memories (SRAM) with non-refresh characteristics.

The antifuse enables repairs at the package level and may be used to increase a net yield, improve product characteristics, and avoid dependence on the prior laser fuse equipment and processes.

Thus, it is important to ensure successful rupture and reliability of a gate oxide layer in an antifuse.

SUMMARY

One or more embodiments relate to a semiconductor device and a method of fabricating the same capable of causing an antifuse to stably operate by rupturing the antifuse at a specific point and stabilizing a current level when rupturing the antifuse.

According to one aspect of an embodiment, there is an antifuse of a semiconductor device. The antifuse may include: a device isolation layer defining a first active region in a semiconductor substrate; a first and second junction regions provided in the first active region; a second active region formed over the first junction region; a gate insulating layer formed over the first active region and the second active region; and a gate electrode formed over the gate insulating layer.

The second active region is a selectively epitaxial-grown-silicon growth layer. The second active region has a rectangular shape having an upper corner, and wherein the stepped portion has a bottom corner that is proximate the upper corner of the second active region. The stepped portion of the gate insulating layer defines a point having a first thickness, wherein a portion of the gate insulating layer overlying the first active region having a second thickness, and wherein the first thickness is less than the second thickness.

The step portion is disposed directly on the first junction region. The antifuse may further includes a first contact plug coupled to the gate electrode; and a second contact plug coupled to the first junction region. A portion of the gate insulating layer on the second active region is configured to be ruptured by a high voltage applied to the first contact plug.

A bottom corner of the stepped portion of the gate insulating layer on the second active region is configured to be ruptured by a high voltage applied to the first contact plug, the bottom corner of the gate insulating layer having a lower thickness than a portion of the gate insulating layer overlying the first active region. The stepped portion of the gate insulating layer is proximate a sidewall of the second active region, where a bottom corner of the stepped portion is configured to be ruptured when a high voltage is applied to the first contact plug.

According to another aspect of an embodiment, there is provided a method of fabricating an antifuse of a semiconductor device. The method may include: forming a second active region over a first active region in a semiconductor substrate; forming a gate insulating layer over the second active region and the first active region, the gate insulating layer having a stepped portion proximate a sidewall of the second active region; forming a gate electrode over the gate insulating layer and the first active region; etching the gate insulating layer and the gate electrode to form a gate pattern; and forming a first junction region in the first active region to overlap the second active region.

The forming the second active region includes forming a silicon growth layer on the first active region using a selective epitaxial growth of silicon (SEG) process. The silicon growth layer is formed to have a rectangular shape. The forming the first junction region is formed simultaneously with a second junction region, the first and second junction regions being separated from each other with the gate pattern. The impurity ions are implanted into the first active region using the gate pattern as a mask to form the first and second junction regions. The method may further include: forming a first metal contact on the gate pattern; and forming a second metal contact on the first junction region. The first junction region being provided directly below the stepped portion.

A bottom corner of the stepped portion of the gate insulating layer is configured to be ruptured if a high voltage is applied to the first contact plug, the bottom corner of the gate insulating layer having a lower thickness than a portion of the gate insulating layer overlying the first active region. The gate electrode is formed directly over the stepped portion of the gate insulating layer. The second active region is formed to have a smaller width than the gate pattern. The forming a gate pattern includes etching the gate insulating layer and the gate electrode until a portion of the first active region and a device isolation layer are exposed.

According to an embodiment, a specific point of a gate insulating layer overlapping a junction region is ruptured when an antifuse is ruptured and thus a current level becomes stable and the antifuse can be stably operate.

These and other features, aspects, and embodiments are described below in the section entitled "DETAILED DESCRIPTION".

BRIEF DESCRIPTION OF THE DRAWINGS

The above and other aspects and features of the embodiments of the present invention will be more clearly understood from the following detailed description taken in conjunction with the accompanying drawings, in which.

DETAILED DESCRIPTION

Figure 1:
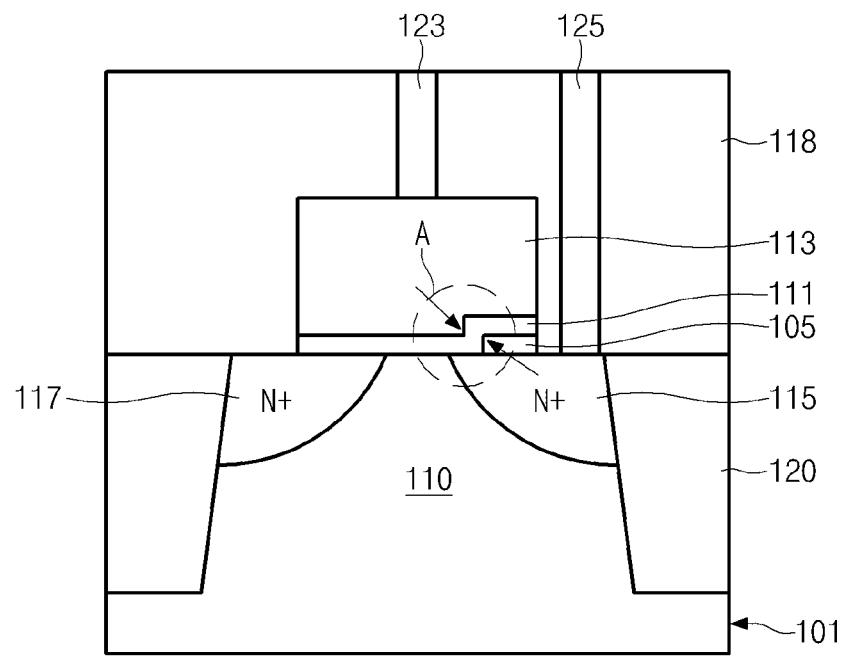
FIG. 1 is a cross-sectional view illustrating an antifuse according to an embodiment of the present invention.

Hereinafter, embodiments of the present invention will be described in greater detail with reference to the accompanying drawings.

The embodiments are described with reference to cross-sectional illustrations which are schematic illustrations of these embodiments (and intermediate structures). As such, variations from the shapes of the illustrations as a result, for example, of manufacturing techniques and/or tolerances, are to be expected. Thus, these embodiments should not be construed as limited to the particular shapes of the regions illustrated herein but may include deviations in shapes that result, for example, from manufacturing. In the drawings, length and size of layers and regions may be exaggerated for clarity. Like reference numerals in the drawings denote like elements. It is also understood that when a layer is referred to as being "on" another layer or substrate, it can be directly on the other or substrate, or intervening layers may also be present.

When a high voltage is applied to a metal contact formed on a gate electrode in an antifuse, a gate insulating layer below the gate electrode is ruptured due to a voltage difference between the high voltage and a low voltage applied through a bit line.

In a conventional method when the gate insulating layer on a channel region below the gate electrode is ruptured, a current-voltage curve between an N type gate electrode and a P type semiconductor substrate shows diode characteristics and gate resistance is increased. Therefore, a breakdown voltage level becomes unstable when the gate insulating layer is ruptured.

Accordingly, in an embodiment of the present invention, the gate insulating layer is ruptured at a specific point thereof on a junction region to reduce a voltage level difference just after the rupture and therefore the antifuse can stably operate.

Hereinafter, embodiments of the present invention will be described with reference to FIGS. 1 to 3H.

Figure 2:
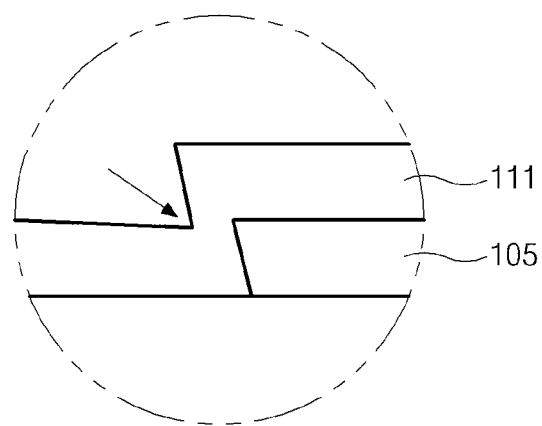
FIG. 2 is an enlarged view of a portion A of FIG. 1 in which the antifuse is ruptured.

FIG. 1 is a cross-sectional view illustrating an antifuse according to an embodiment of the present invention and FIG. 2 is an enlarged view of a portion A of FIG. 1 in which rupture occurs.

Referring to FIG. 1, a gate electrode 113 and a first metal contact (or first contact plug) 123 and a second metal contact (or second contact plug) 125 are provided over a semiconductor substrate 101 in which an active region 110 is defined by a device isolation layer 120. When a high voltage (e.g., 6 V) is applied to the metal contact 123, a stepped portion A of a gate insulating layer 111 on a junction region 115 is ruptured. Thus, current flows to the metal contact 125 through the junction region 115.

Thus, in an embodiment of the present invention, junction regions 117 and 115 are formed in the first active region 110 and a second active region 105 is formed on one side of a top of the junction region 115 through a selective epitaxial growth of silicon (SEG) process. Upper surfaces of the first and second active regions 110 and 105 are stepped and the gate insulating layer 111 is formed on the first and second active regions 110 and 105 along the step thereof. The gate electrode 113 is formed to be stacked on the gate insulating layer 111. The metal contact 123 is formed on the gate electrode 113 and the metal contact 125 is formed on the top of the junction region 115 on the other side of where the second active region 105 is formed on. At this time, the gate insulating layer 111 may be formed by diffusion of an oxidizing agent of the first and second active regions 110 and 105 and interface reaction with a silicon (Si) material of the first and second active regions 110 and 105.

Referring to FIG. 2, the diffusion of the oxidizing agent through a silicon oxide ($SiO_2$) previously formed is relatively more difficult in the stepped portion A of the gate insulating layer 111, that is, the oxidizing speed is reduced at a bottom corner A of the second active region 105 as compared to a top and side of the second active region 105. Therefore, the gate insulating layer has a lower thickness at the bottom corner A.

When the silicon oxide ($SiO_2$) is formed through oxidation of silicon (Si) of the second active region 105, stress is induced due to volume expansion. The stress is concentrated on the bottom corner A and the oxidizing speed is reduced at that location. Therefore, the gate insulating layer has a lower thickness at the bottom corner A. In an embodiment, the bottom corner A defines a sharp point where the gate insulating layer 111 is to be ruptured.

In an embodiment, the second active region 105 having a rectangular shape is grown on the first active region 110, where a step is formed between the first active region 110 and the second active region 105. The gate insulating layer 111 is formed on the first active region 110 and the second active region 105. The gate insulating layer 111 is formed to have a lower thickness at the stepped portion A thereof (at a bottom corner A thereof). The stepped portion A (or bottom corner A) is proximate an upper corner of the second active region 105 and is formed on the junction region 115. The stepped portion A may also be proximate a sidewall of the second active region 105. In an embodiment, the bottom corner A is formed directly over the junction region. The gate insulating layer 111, therefore, is configured to define a point (or the bottom corner A) where a rupture is to occur when a high voltage is applied. The gate insulating layer 111 at the bottom corner A has a lower thickness than that portion directly overlying the first active region 110.

Hereinafter, a method of manufacturing an antifuse according to an embodiment of the present invention will be described with reference to FIGS. 3A to 3H.

First, referring to FIG. 3, a device isolation layer 120 defining a first active region 110 is formed in a semiconductor substrate 101. At this time, the first active region 110 may be formed by implanting a P type impurity ion.

Figure 3A:
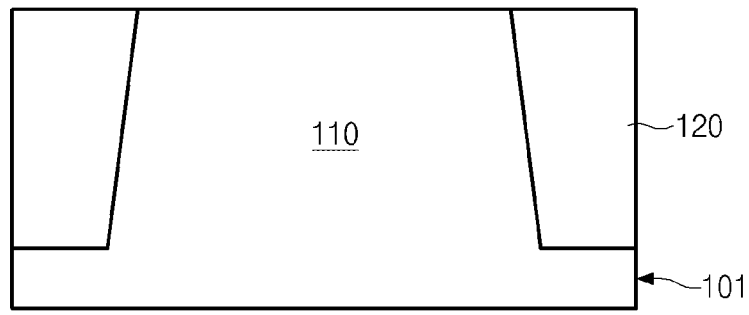
FIGS. 3A to 3H are cross-sectional views illustrating a method of fabricating an antifuse according to an embodiment of the present invention.
Figure 3B:
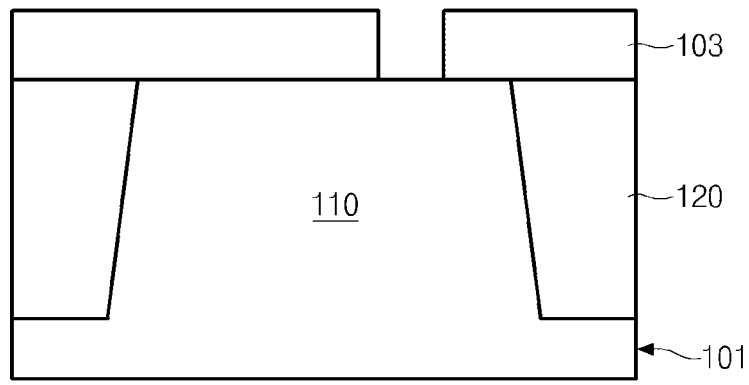

Referring to FIG. 3B, a photoresist pattern 103 for a second active region is formed on the first active region 110 and the device isolation layer 120 of the semiconductor substrate 101. The photoresist pattern 103 is formed to expose the first active region 110 in which a junction region (not shown) is to be formed.

Figure 3C:
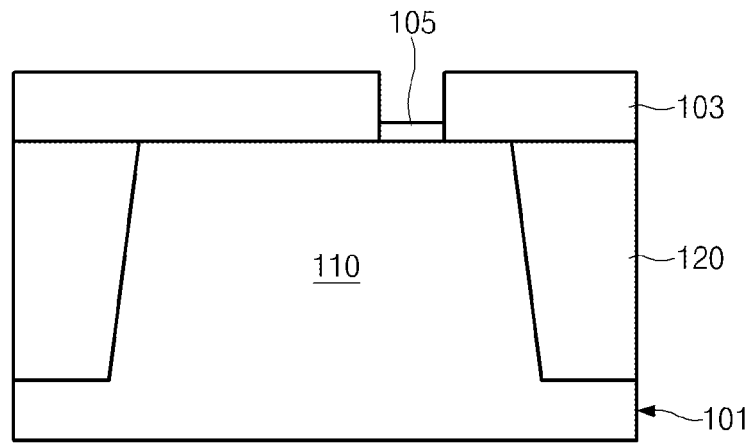

Referring to FIG. 3C, a silicon grown layer (second active region) 105 is grown on the exposed first active region 110 to a predetermined thickness through a selective epitaxial growth of silicon (SEG) process. In an embodiment, the first active region 110 is formed to have a rectangular shape.

Figure 3D:
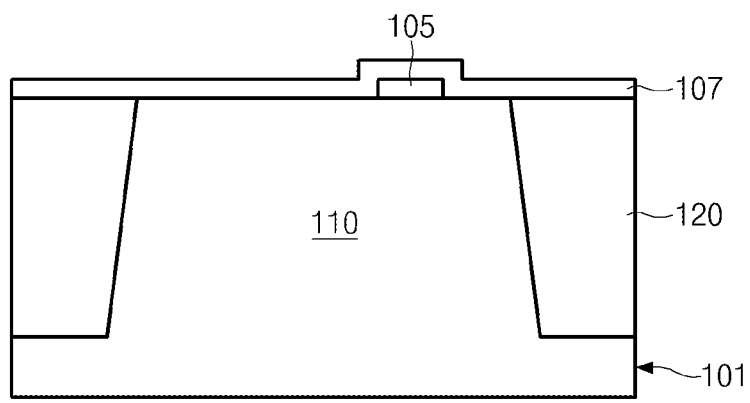

Referring to FIG. 3D, the photoresist pattern 103 is removed and an oxidation process is performed on the first and second active regions 110 and 105 to form an oxide layer 107 on the first and second active regions 110 and 105 along a step thereof. Oxidation speed is reduced in a stepped portion of the oxide layer 107 (a bottom corner of the second active region 105) and a gate insulating layer is formed so that the stepped portion of the oxide layer 107 has a lower thickness than the oxide layer 107 on a top and side of the second active region 105. The oxide layer 107 may be formed by implanting nitrogen ($N_2$) ions into the semiconductor substrate and performing a thermal oxidation process on the semiconductor substrate. The oxide layer 107 may be formed to have a thickness in the range of 50 to 60 Å.

Figure 3E:
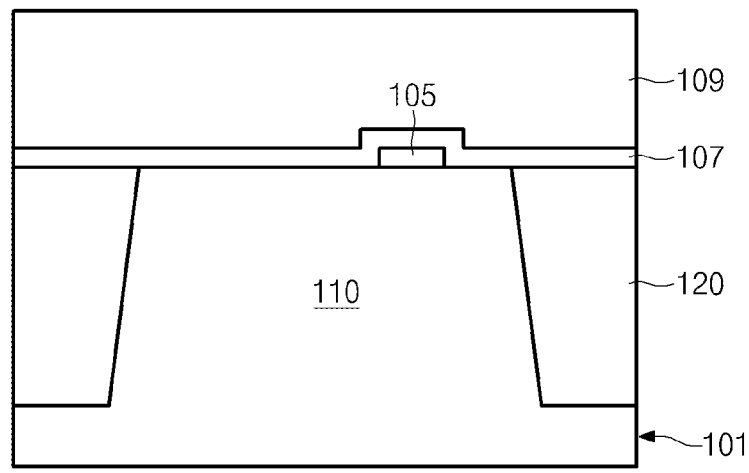

Referring to FIG. 3E, a gate electrode material 109 is deposited on the oxide layer 107. Then the gate electrode material 109 and the oxide layer 107 are etched using a photoresist pattern (not shown) as a mask until a portion of the first active region 110 and the device isolation layer 120 are exposed forming a gate pattern 100 in which a gate insulating layer 111 and the gate electrode 113 are stacked. Although not shown, the gate pattern 100 may be formed by sequentially stacking a barrier layer, a tungsten silicide, and a hard mask formed of a nitride layer. Further, the gate electrode 113 may include at least one selected from the group consisting of polymer, tungsten (W), titanium (Ti), and titanium nitride (WN). The gate electrode 113 may be formed of a single layer or multiple layers.

Figure 3F:
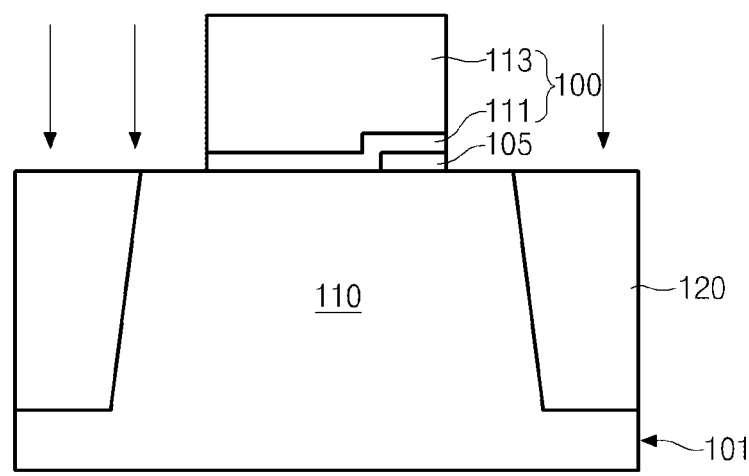

Referring to FIG. 3F, an impurity ion is implanted into the exposed first active region 110 using the gate electrode 113 as a mask to form junction regions 115 and 117. At this time, heat is applied to the junction regions 115 and 117 to cause ions in the junction regions 115 and 117 to be diffused into the active region below the gate pattern 110. Therefore, the second active region 105 overlaps the junction region 115.

Figure 3G:
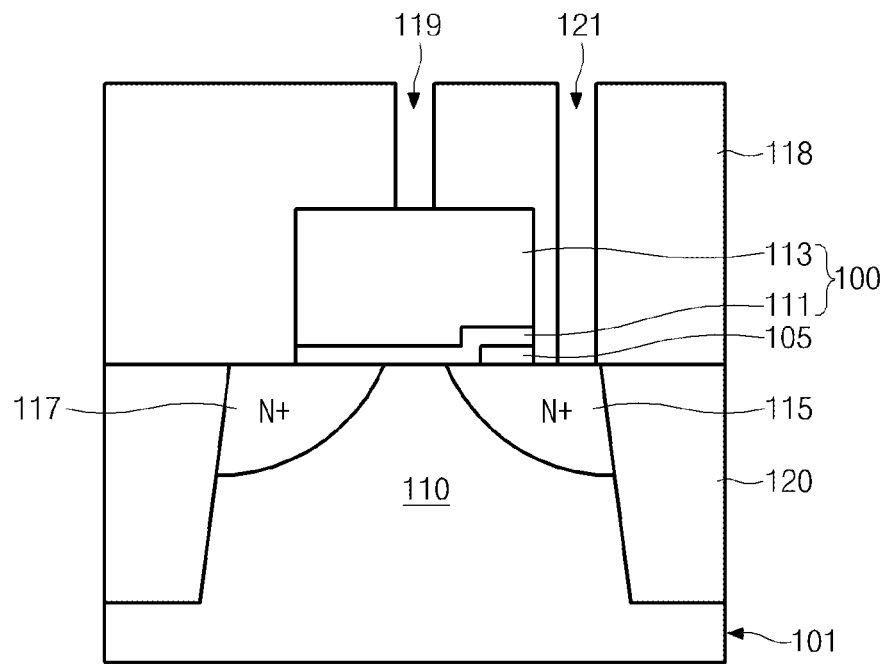

Referring to FIG. 3G, an interlayer insulating layer 118 is formed on the semiconductor substrate 101 including the gate pattern 110 and a photoresist pattern (not shown) is formed on the interlayer insulating layer 118. The interlayer insulating layer 118 is etched using the photoresist pattern as a mask to form metal contact holes 119 and 121 exposing the gate electrode 113 and the junction region 115. At this time, the interlayer insulating layer 118 may be formed of an oxide layer. The interlayer insulating layer 118 may be formed in a single layer or a staked layer including at least two layers selected from the group consisting of a high density plasma (HDP) oxide layer, a boron phosphorus silicate glass (BPSG) layer, a phosphorus silicate glass (PSG) layer, a boron silicate glass (BSG) layer, a tetra ethyle ortho silicate (TEOS) layer, an undoped silicate glass (USG) layer, a fluorinated silicate glass (FSG) layer, a carbon doped oxide (CDO) layer, and a organo silicate glass (OSG) layer. Alternatively, the interlayer insulating layer 118 may be formed of a layer coated through a spin coating method such as a spin on dielectric (SOD) layer.

Figure 3H:
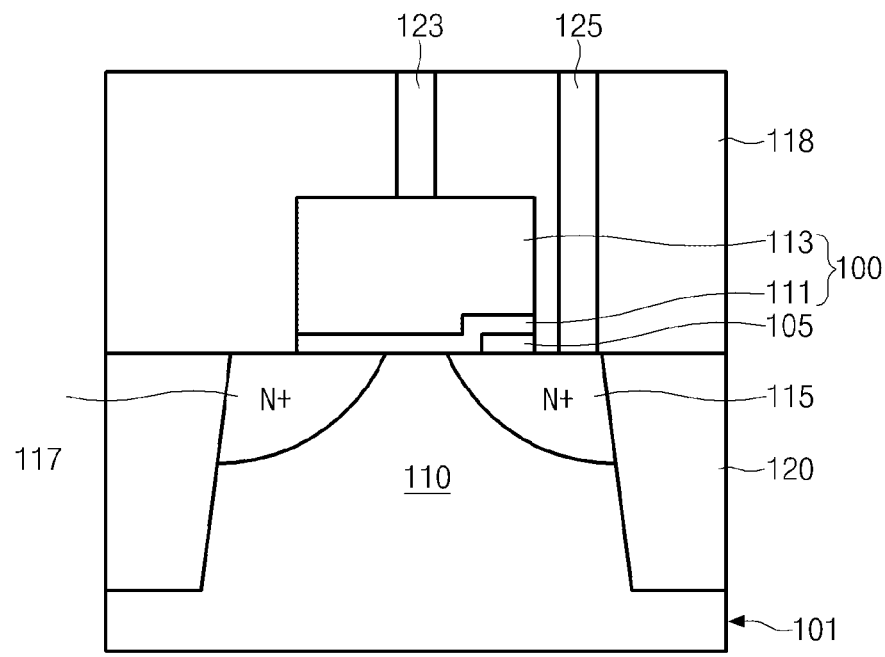

Referring to FIG. 3H, a conductive material is deposited on the interlayer insulating layer 118 to be buried within the metal contact holes 119 and 121 and planarized until the interlayer insulating layer is exposed to form metal contacts 123 and 125. The planarization may be performed using a chemical mechanical polishing (CMP) process. The metal contact 123 and 125 may be formed of tungsten (W), titanium (Ti), and titanium nitride (TiN) and may serve as a bit line contact.

According to an embodiment of the present invention, silicon is grown on a junction region to form a step between the first and second active regions 110 and 105 and the gate insulating layer 111 is formed on the first and second active regions 110 and 105 along the step thereof. A stepped portion (a bottom corner of the second active region) in which a top of the first active region 110 is in contact with a side of the second active region 105 is formed on the junction region 115. When a high voltage is applied to the metal contact 123 on the gate electrode 113, the gate insulating layer is ruptured only on the junction region 115 to improve voltage level instability.

That is, if the insulating layer 111 is ruptured in a channel region between the junction regions 115 and 117, a current-voltage curve between an N type gate pattern and the P type semiconductor substrate 101 behaves like a diode and a gate resistance is increased. However, if the gate insulating layer is ruptured on the junction region 115, the current-voltage curve between the N type gate pattern and the N type junction region 105 shows ohmic characteristics and the gate resistance is not increased.

In an embodiment of the present invention, the gate insulating layer 111 on the junction region 105 is ruptured and a current level difference is reduced after the antifuse is ruptured. Therefore, the antifuse can stably operate.

As mentioned above, in order to form an upper surface of a gate insulating layer to have a different height, there is a method of forming a gate insulating layer to have a different thickness, thereby forming a step. However, the method may perform an oxidation process several times and thus be increased in process complexity. Further, the antifuse of an embodiment has advantageous in terms of resistance distribution in that the rupture can be controlled to occur at a particular point (e.g., at a bottom corner of the gate insulating layer) rather than arbitrarily at any portion of the gate insulating layer.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device having an antifuse, the antifuse comprising:
   a device isolation layer defining a first active region in a semiconductor substrate;
   a first and second junction regions provided in the first active region;
   a second active region formed over the first junction region;
   a gate insulating layer formed over the first active region and the second active region and having a stepped portion; and
   a gate electrode formed over the gate insulating layer,
   wherein the second active region overlaps the first junction region.

2. The antifuse of claim 1, wherein the second active region is a selectively epitaxial-grown-silicon growth layer.

3. The antifuse of claim 1, wherein the second active region has a rectangular shape having an upper corner, and
   wherein the stepped portion has a bottom corner that is proximate to the upper corner of the second active region.

4. The antifuse of claim 1, wherein the stepped portion of the gate insulating layer defines a point having a first thickness,
   wherein a portion of the gate insulating layer overlying the first active region has a second thickness, and
   wherein the first thickness is less than the second thickness.

5. The antifuse of claim 1, wherein the stepped portion is disposed directly on the first junction region.

6. The antifuse of claim 1, further comprising:
   a first contact plug coupled to the gate electrode; and
   a second contact plug coupled to the first junction region.

7. The antifuse of claim 6, wherein a portion of the gate insulating layer on the second active region is configured to be ruptured by a high voltage applied to the first contact plug.

8. The antifuse of claim 6, wherein a bottom corner of the stepped portion of the gate insulating layer on the second active region is configured to be ruptured by a high voltage applied to the first contact plug, the bottom corner of the gate insulating layer having a lower thickness than a portion of the gate insulating layer overlying the first active region.

9. The antifuse of claim 6, wherein the stepped portion of the gate insulating layer is proximate to a sidewall of the second active region, where a bottom corner of the stepped portion is configured to be ruptured when a high voltage is applied to the first contact plug.

10. The semiconductor device of claim 6, wherein the gate insulation layer separates a first conductive path between the first metal contact and the gate electrode from a second conductive path between the second metal contact, the first junction region, and the second active region.

11. The semiconductor of claim 6, wherein an antifuse blowing operation ruptures the gate insulating layer which connects the first electrical path to the second electrical path, resulting in a conductive path between the first metal contact and the second metal contact.

12. The antifuse of claim 1, wherein the stepped portion comprises:
    a first convex surface disposed against the second active region;
    a second convex surface disposed against the gate electrode;
    a first concave surface disposed against the gate electrode; and
    a second concave surface disposed against the second active region.

13. The antifuse of claim 12, wherein a portion of the gate insulation layer over a bottom corner of the second active region has a first thickness, and portions of the gate insulation layer disposed over the gate electrode and the second junction region have a second thickness that is greater than the first thickness.

14. The antifuse of claim 1, wherein a concave surface of the gate insulating layer disposed against the gate electrode is recessed from a convex surface of the gate insulating layer disposed against the gate electrode.

15. The antifuse of claim 1, wherein the second active region is in direct contact with the first active region.

16. The antifuse of claim 15, wherein the second active region is in direct contact with the first junction region.

17. The semiconductor device of claim 1, wherein an upper surface of the stepped portion of the gate insulation layer includes an outer corner, and an inner corner that is inset towards the second active region from the outer corner.

18. The semiconductor device of claim 1, wherein an upper surface of the stepped portion of the gate insulation layer includes an outer corner, and an inner corner that is recessed from the outer corner.

19. A semiconductor device having an antifuse, the antifuse comprising:
    a device isolation layer defining a first active region in a semiconductor substrate;
    a first junction region and a second junction region disposed in the first active region;
    a second active region disposed directly on the first junction region;
    a gate insulating layer formed over the first active region and the second active region and having a stepped portion; and
    a gate electrode formed over the gate insulating layer.

* * * * *